US011549650B2

(12) United States Patent
Van Bommel et al.

(10) Patent No.: US 11,549,650 B2
(45) Date of Patent: Jan. 10, 2023

(54) LED FILAMENT ARRANGEMENT

(71) Applicant: SIGNIFY HOLDING B.V., Eindhoven (NL)

(72) Inventors: Ties Van Bommel, Horst (NL); Rifat Ata Mustafa Hikmet, Eindhoven (NL)

(73) Assignee: Signify Holding B.V., Eindhoven (NL)

(*) Notice: Subject to any disclaimer, the term of this patent is extended or adjusted under 35 U.S.C. 154(b) by 0 days.

(21) Appl. No.: 17/424,424

(22) PCT Filed: Jan. 14, 2020

(86) PCT No.: PCT/EP2020/050769
§ 371 (c)(1),
(2) Date: Jul. 20, 2021

(87) PCT Pub. No.: WO2020/151994
PCT Pub. Date: Jul. 30, 2020

(65) Prior Publication Data
US 2022/0136658 A1 May 5, 2022

(30) Foreign Application Priority Data

Jan. 24, 2019 (EP) .................... 19153431

(51) Int. Cl.
F21V 15/00 (2015.01)
F21K 9/232 (2016.01)
(Continued)

(52) U.S. Cl.
CPC .............. *F21K 9/232* (2016.08); *F21V 23/06* (2013.01); *H01L 25/0753* (2013.01);
(Continued)

(58) Field of Classification Search
CPC ... F21K 9/232; F21K 9/27; F21K 9/62; H01L 25/0753; H01L 33/50; H01L 33/60;
(Continued)

(56) References Cited

U.S. PATENT DOCUMENTS 2,062,512 A * 12/1936 Hine ...................... B60J 3/0291
359/449
6,607,794 B1 * 8/2003 Wilson ...................... C08K 5/02
428/34.1
(Continued)

FOREIGN PATENT DOCUMENTS

CN 104930384 A 9/2015
WO 2016162616 A1 10/2016
(Continued)

*Primary Examiner* — Omar Rojas Cadima

(57) ABSTRACT

A light emitting diode, LED, filament arrangement (100) is provided. The LED filament arrangement comprises at least one LED filament (120) which in turn comprises an array of a plurality of light emitting diodes (140), LEDs. The at least one LED filament extends along an axis, A. The LED filament arrangement further comprises at least one reflector element (200) which is configured to at least partially reflect
(Continued)

the light emitted from the at least one LED filament during operation. The at least one reflector element has a spiral shape and is arranged at least partially around the at least one LED filament such that the at least one reflector element extends along the axis, A.

11 Claims, 4 Drawing Sheets

(51) Int. Cl.
*F21V 23/06* (2006.01)
*H01L 25/075* (2006.01)
*H01L 33/50* (2010.01)
*H01L 33/60* (2010.01)
*H01L 33/64* (2010.01)
*F21Y 115/10* (2016.01)

(52) U.S. Cl.
CPC .............. *H01L 33/50* (2013.01); *H01L 33/60* (2013.01); *H01L 33/644* (2013.01); *F21Y 2115/10* (2016.08)

(58) Field of Classification Search
CPC .............. H01L 33/644; F21Y 2115/10; F21Y 2103/10; F21V 23/06; F21V 7/0008; G02B 6/001; G02B 6/0035; G02F 1/133611; G02F 1/133605; F21S 4/24; H01K 1/325

See application file for complete search history.

(56) References Cited

U.S. PATENT DOCUMENTS

| | | | |
|---|---|---|---|
| 9,528,689 B2* | 12/2016 | Veres | F21V 3/049 |
| 2002/0191396 A1* | 12/2002 | Reiff | F21V 5/04 |
| | | | 362/183 |
| 2009/0135581 A1* | 5/2009 | Yano | H01L 33/52 |
| | | | 362/310 |
| 2012/0326634 A1* | 12/2012 | Li | H05B 47/18 |
| | | | 315/312 |
| 2013/0050998 A1* | 2/2013 | Chu | F21K 9/27 |
| | | | 362/218 |
| 2013/0070170 A1* | 3/2013 | Namekata | G02F 1/133603 |
| | | | 348/836 |
| 2016/0102822 A1* | 4/2016 | Van Delden | F21K 9/27 |
| | | | 313/512 |
| 2018/0031185 A1 | 2/2018 | Pettmann | |
| 2018/0283674 A1* | 10/2018 | Huang | F21K 9/232 |

FOREIGN PATENT DOCUMENTS

| | | |
|---|---|---|
| WO | 2018041826 A1 | 3/2018 |
| WO | 2018184889 A1 | 10/2018 |
| WO | 2018202625 A1 | 11/2018 |

* cited by examiner

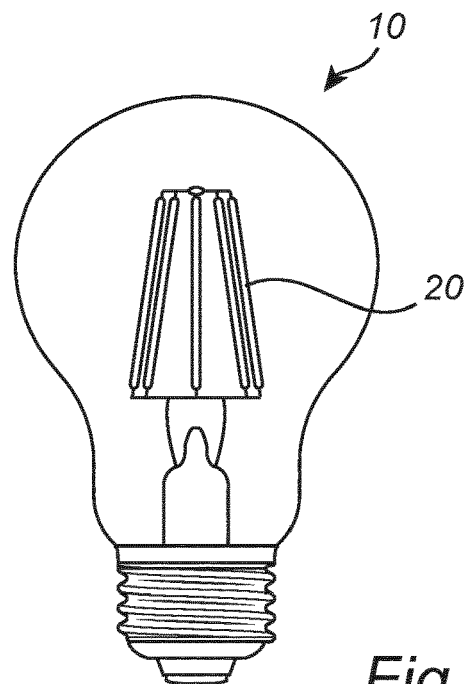
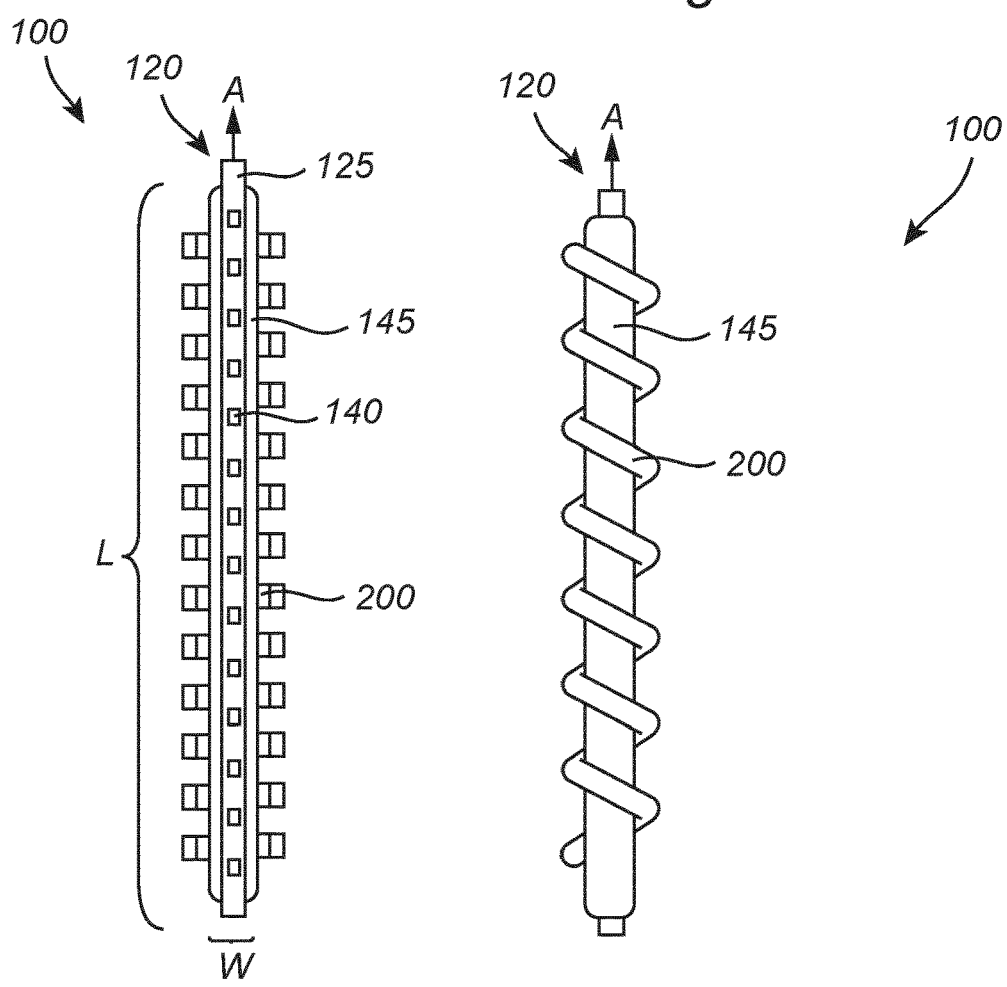
Fig. 1
Fig. 2
Fig. 3

LED FILAMENT ARRANGEMENT

CROSS-REFERENCE TO PRIOR APPLICATIONS

This application is the U.S. National Phase application under 35 U.S.C. § 371 of International Application No. PCT/EP2020/050769, filed on Jan. 14, 2020, which claims the benefit of European Patent Application No. 19153431.2, filed on Jan. 24, 2019. These applications are hereby incorporated by reference herein.

FIELD OF THE INVENTION

The present invention generally relates to lighting arrangements comprising one or more light emitting diodes (LEDs). More specifically, the present invention is related to a LED filament arrangement.

BACKGROUND OF THE INVENTION

The use of light emitting diodes (LEDs) for illumination purposes continues to attract attention. Compared to incandescent lamps, fluorescent lamps, neon tube lamps, etc., LEDs provide numerous advantages such as a longer operational life, a reduced power consumption, and an increased efficiency related to the ratio between light energy and heat energy.

In particular, there is currently a very large interest in lighting devices and/or arrangements (such as lamps) provided with LEDs, and incandescent lamps are rapidly being replaced by LED-based lighting solutions. It is nevertheless appreciated and desired to have retrofit lighting devices (e.g. lamps) which have the look of an incandescent bulb. For this purpose, it is possible to make use of the infrastructure for producing incandescent lamps based on LED filaments arranged in such a bulb. In particular, LED filament lamps are highly appreciated as they are very decorative.

However, there is a wish to provide alternatives for the arrangement of the components of the LED filament lamps, in particular regarding LED filament lamps comprising one or more reflectors. More specifically, LED filament lamps according to the prior art may have an unsatisfactory efficiency.

Hence, it is an object of the present invention to provide alternatives to LED filament lamps of the prior art in order to improve their efficiency during operation. WO 2016/162616 discloses a lighting device comprising several LED filaments disposed inside an external container at least partially transparent. Each LED filament comprising a slimline substrate, a plurality of light-emitting diodes regularly distributed in line on the substrate. The external container forming a hollow and slimline component provided with two opposite ends, and the LED filaments being laid out according to at least one lighting line, where the or each lighting line comprises several LED filaments disposed in alignment one after the other and their anodes are connected to the anode output terminal and their cathodes are connected to the cathode output terminal.

SUMMARY OF THE INVENTION

It is of interest to provide alternatives to LED filament lamps of the prior art in order to improve their efficiency during operation.

This and other objects are achieved by providing a LED filament arrangement and a LED filament device having the features in the independent claims. Preferred embodiments are defined in the dependent claims.

Hence, according to a first aspect of the present invention, there is provided a light emitting diode, LED, filament arrangement. The LED filament arrangement comprises at least one LED filament which in turn comprises an array of a plurality of light emitting diodes, LEDs. The at least one LED filament extends along an axis, A. The LED filament arrangement further comprises at least one reflector element which is configured to at least partially reflect the light emitted from the at least one LED filament during operation. The at least one reflector arrangement has a spiral shape and is arranged at least partially around the at least one LED filament such that the at least one reflector element extends along the axis.

According to a second aspect of the present invention, there is provided a LED filament device. The LED filament device comprises at least one LED filament which in turn comprises an array of a plurality of light emitting diodes, LEDs. The at least one LED filament extends along an axis, A. The LED filament device further comprises at least one reflector structure which is configured to at least partially reflect the light emitted from the at least one LED filament during operation. The at least one reflector structure has a tubular shape and comprises a plurality of holes, and wherein the at least one reflector structure is arranged at least partially around the at least one LED filament.

Thus, the first and the second aspects of the present invention are based on the common concept or idea of providing a LED filament arrangement or device wherein the reflector element(s) are provided to at least partially reflect the light emitted from the at least one LED filament during operation. According to the first aspect of the present invention, the reflector element(s) has a spiral (coil) shape, and is arranged or wound around the LED filament(s). According to the second aspect of the present invention, the reflector structure(s) has a tubular shape and comprises a plurality of holes, and wherein the reflector structure is arranged around the at least one LED filament. The reflector element(s) or structure(s) are able to at least partially reflect the light emitted from the LEDs of the LED filament(s) during operation of the LED filament arrangement, in order to provide an improved and/or a desired distribution of light from the LED filament(s) of the LED filament arrangement. Hence, the first and the second aspects of the present invention share a common general inventive concept of providing an improved and/or a desired distribution of light from the LED filament(s) of the LED filament arrangement.

It will be appreciated that the LED filament arrangement/device may distribute the light emitted from the LEDs of the LED filament(s) by means of the reflector element(s)/structure(s). The present invention is hereby advantageous in that the LED filament arrangement or device may direct/distribute the light in order to achieve a different light distribution compared to a LED filament unit without any reflector elements or structures. For example, the reflector element(s)/structure(s) according to the present invention may be configured in such a way that (substantially) no light is transmitted through the reflector element(s) or structure(s) as seen by an observer. This obstruction of the light emitted from the LED filament by the reflector element or structure renders an aesthetically appealing effect.

The present invention is further advantageous in that the reflector element(s) or structure(s) of the LED filament arrangement/device may be conveniently designed to provide a desired lighting distribution in terms of illumination and/or decorative purposes. For example, the material properties and/or the shape of the reflector element(s)/structure(s), for changing reflection properties thereof, may be chosen for different lighting purposes of the LED arrangement/device.

It will be appreciated that the LED filament arrangement/device of the present invention furthermore comprises relatively few components. The relatively low number of components is advantageous in that the LED filament arrangement or device is relatively inexpensive to fabricate. Moreover, the LED filament arrangement or device implies an easier recycling, especially compared to devices or arrangements in the prior art comprising a relatively high number of components which impede an easy disassembling and/or recycling operation.

The LED filament arrangement and LED filament device according to the first and the second aspects of the present invention comprise at least one LED filament. The at least one LED filament, in its turn, comprises an array of LEDs. By the term "array", it is here meant a linear arrangement or chain of LEDs, or the like, arranged on the LED filament(s). The LED filament arrangement according to the first aspect of the present invention comprises at least one reflector element. By the term "reflector element", it is here meant an element, structure, unit, or the like, which is configured to distribute, scatter, spread, direct, refract, reflect and/or transfer light emitted from the LEDs of the LED filament(s). The reflector element(s) has (have) a spiral shape. By the wording "spiral shape", it is here meant a spiral and/or coil shape with a meandering structure. The reflector element(s) is (are) arranged or wound around the LED filament(s) such that they extend along the same axis, A, as the LED filament(s). The LED filament device according to the second aspect of the present invention comprises at least one reflector structure. Analogously with the reflector element of the first aspect of the present invention, it is by the term "reflector structure" meant an element, structure, unit, or the like, which is configured to distribute, scatter, spread, direct, refract, reflect and/or transfer light emitted from the LEDs of the LED filament(s). In contrast to the reflector element, the reflector structure has a tubular shape and comprises a plurality of holes, wherein the reflector structure is arranged at least partially around the at least one LED filament.

According to an embodiment of the present invention, the at least one reflector element may have a wire shape and may have a cross-section which is smaller than the cross-section of the at least one LED filament. By the term "wire shape", it is here meant that the reflector element has the shape of a cord, wire, or the like, which furthermore may be relatively thin. The present embodiment is advantageous in that the LED filament arrangement may emit a majority of the light from the LED filament directly, i.e. without any reflection or obstruction. Accordingly, the reflector element may reflect a predetermined, minor portion of the light emitted from the LED filament during operation of the LED filament arrangement.

According to an embodiment of the present invention, the at least one reflector element comprises a first portion and a second portion. The first portion of the reflector element faces the at least one LED filament, wherein the first portion is arranged to reflect the light emitted from the at least one LED filament during operation. The second portion of the reflector element faces away from the at least one LED filament, wherein the second portion is opaque. Hence, the first and second portion of the reflector element are adjacently arranged along an axis, B, which is perpendicular to the axis, A, of the LED filament(s). During operation of the LED filament arrangement, the light emitted from the LEDs of the LED filament(s) is diffracted and/or reflected by the first portion of the reflector element. The opaque (e.g. black-colored) second portion of the reflector element is non-transmissive, i.e. does not transmit any light. Hence, the first portion of the reflector element is able to diffract and/or reflect a portion of the light emitted from the LEDs of the LED filament(s) in a desired way, whereas the second portion is able to block or obstruct the light emitted from the LEDs of the LED filament(s), e.g. in the direction of an observer. The present embodiment is advantageous in that a desired and/or predetermined light distribution (pattern) may be achieved during operation of the LED filament arrangement while at the same time achieving an aesthetically appealing effect of the LED filament arrangement.

According to an embodiment of the present invention, the second portion of the at least one reflector element may be light absorbing. By "light absorbing", it is here meant that the material of the second portion absorbs the energy of the light from the plurality of the LEDs during operation of the LED filament arrangement. Hence, the light from the plurality of LEDs is absorbed by the object, never again to be released in the form of light.

According to an embodiment of the present invention, the first portion of the at least one reflector element may have a cross section with a circular shape. Hence, the first portion of the reflector element may have a circular cross-section, and reflect and/or diffract the light emitted from the LED filament(s) during operation of the LED filament arrangement. Alternatively, according to another embodiment of the present invention, the first portion may have a cone shape, wherein the apex of the first portion faces the at least one LED filament. In other words, the first portion of the reflector element may be shaped as a cone with a triangular-shaped cross-section.

According to an embodiment of the present invention, the first portion of the at least one reflector structure may comprise a coating which comprises particles selected from the group consisting of $Al_2O_3$, $BaSO_4$, and $TiO_2$.

According to an embodiment of the present invention, the LED filament arrangement may further comprise an encapsulant at least partially enclosing the plurality of LEDs. The encapsulant may comprise a luminescent material and may be configured to at least partly convert the light emitted by the plurality of LEDs. By the term "encapsulant", it is here meant a material, element, arrangement, or the like, which is configured or arranged to surround, encapsulate and/or enclose the plurality of LEDs of the LED filament(s). The luminescent material of the encapsulant is configured to emit light under external energy excitation. For example, the luminescent material may comprise a fluorescent material. The luminescent material may comprise an inorganic phosphor, an organic phosphor and/or quantum dots/rods. The encapsulant is configured to at least partly convert the light emitted by the plurality of LEDs into converted light. For example, a UV/blue LED light may be partially or fully absorbed by the luminescent material and converted to light of another color e.g. green, yellow, orange and/or red.

According to an embodiment of the present invention, the reflectivity of the at least one reflector element may be at least 80% (preferred), such as at least 85% (more preferred), such as at least 90% (most preferred). The present embodiment is advantageous in that the relatively high reflectivity of the reflector element(s) leads to a relatively high light output efficiency of the LED filament arrangement.

According to an embodiment of the present invention, the at least one reflector element may be in thermal connection with the at least one LED filament for a dissipation of heat from the at least one LED filament during operation. By the term "thermal connection", it is here meant that the reflector element(s) and the LED filament(s) may be in physical contact with each other, wherein the thermal connection is enabled via heat conductivity. Alternatively, the reflector element(s) and the LED filament(s) may be (physically) separated, wherein the thermal connection is enabled via heat radiation.

According to an embodiment of the present invention, the LED filament arrangement may further comprise a heat dissipator which may be coupled to the at least one reflector element for a dissipation of heat from the at least one LED filament to the heat dissipator during operation of the at least one LED filament. By the term "heat dissipator", it is here meant substantially any element, device, unit, or the like, which is able to dissipate heat. The present embodiment is advantageous in that the LED filament arrangement comprising the heat dissipator may efficiently and conveniently dissipate excessive heat from the LEDs of the LED filament(s) during operation of the LED filament arrangement, which may lead to an even longer operational life and/or efficiency of the LED filament arrangement. Another advantageous aspect of the embodiment of the present invention is that the improved thermal management as achieved allows a higher current powering of the LED filament in order to provide a higher luminous flux.

According to an embodiment of the present invention, at least one of the at least one LED filament and at least one of the at least one reflector element may be in physical contact with each other. The present embodiment is advantageous in that the transfer of heat from the LEDs of the LED filament(s) during operation of the LED filament arrangement may be improved even further. Furthermore, the present embodiment is advantageous in that the LED filament arrangement may be relatively compact, as the reflector element(s) are in physical contact with the LED filament(s). Alternatively, and according to another embodiment of the present invention, at least one of the at least one LED filament and at least one of the at least one reflector element may be arranged at a distance from each other in a direction, B, perpendicular to the axis, A.

According to an embodiment of the present invention, the at least one LED filament may be configured to emit light omnidirectionally in the plane perpendicular to the axis, A. By the term "omnidirectionally", it is here meant that the light from the LED filament(s) may be emitted in all directions. Hence, according to the embodiment, the light from the LED filament(s) may be emitted in a circumferential manner with respect to the arrangement of the LED filament(s) along the longitudinal axis. As the LED filament(s) of the LED filament arrangement may provide a distribution of light into (almost) all directions from the LED filament(s), the present embodiment is advantageous in that a desired and/or customized lighting may be achieved.

According to an embodiment of the present invention, the at least one LED filament may extend along a curved axis. Hence, the reflector element(s) of spiral shape of the LED filament arrangement, which is arranged at least partially around the LED filament(s), is (are) also curved. The present embodiment is advantageous in that a reflector element may provide mechanical stability for a LED filament in case the latter is curved.

According to an embodiment of the present invention, the LED filament arrangement may further comprise a frame for supporting the at least one LED filament. The present embodiment is advantageous in that the frame may provide mechanical stability for the LED filament(s). It will be appreciated that the present embodiment may advantageously be combined with a heat dissipator of a previously described embodiment, such that a LED filament arrangement comprising a frame, which in turn comprises a heat dissipator, may provide mechanical stability in combination with thermal management for the LED filament(s).

According to an embodiment of the second aspect of the present invention, the area of the holes with respect to the circumferential area of the at least one reflector structure, in a direction, B, perpendicular to the axis, A, is at least 50%, such as at least 60%, such as at least 65%. In other words, the tubular shape of the reflector structure(s) are provided with holes, such that the total area of the holes with respect to the circumferential area of the reflector structure(s) is 50-65%, or even more. The present embodiment is advantageous in that a desired balance may be achieved between the portion of the light from the LEDs of the LED filament arrangement being emitted directly, i.e. without any reflection, and the portion of the light which is reflected by the reflector element(s).

According to an embodiment of the present invention, there is provided a lighting device. The lighting device may comprise a light source comprising at least one LED filament arrangement according to any one of the preceding embodiments of the first aspect of the present invention and/or at least one LED filament device according to any one of the preceding embodiments of the second aspect of the present invention. The lighting device may further comprise a cover comprising an at least partially transparent material, wherein the cover at least partially encloses the light source. The lighting device may further comprise an electrical connection connected to the light source for a supply of power to the plurality of LEDs of the light source. By the term "cover", it is here meant an enclosing element, such as a cap, cover, envelope, or the like, comprising an at least partial translucent and/or transparent material. The present embodiment is advantageous in that the LED arrangement according to the invention may be conveniently arranged in substantially any lighting device, such as a LED filament lamp, luminaire, lighting system, or the like. The lighting device may further comprise a driver for supplying power the LEDs of the LED filament arrangement. Additionally, the lighting device may further comprise a controller for individual control of two or more subsets of LEDs of the LED filament arrangement, such as a first set of LEDs, a second set of LEDs, etc.

Further objectives of, features of, and advantages with, the present invention will become apparent when studying the following detailed disclosure, the drawings and the appended claims. Those skilled in the art will realize that different features of the present invention can be combined to create embodiments other than those described in the following.

BRIEF DESCRIPTION OF THE DRAWINGS

This and other aspects of the present invention will now be described in more detail, with reference to the appended drawings showing embodiment(s) of the invention.

FIG. 1 schematically shows a LED filament lamp according to the prior art, comprising LED filaments, FIG. 2 schematically shows a cross-sectional view of a LED filament arrangement according to an exemplifying embodiment of the present invention, FIG. 3 schematically shows a LED filament arrangement according to an exemplifying embodiment of the present invention, FIGS. 4a-b schematically show portions of a LED filament arrangement according to exemplifying embodiments of the present invention, FIGS. 5-7 schematically show LED filament arrangements according to exemplifying embodiments of the present invention, FIG. 8 schematically shows a LED filament device according to an exemplifying embodiment of the present invention, and FIG. 9 schematically shows a lighting device comprising a LED filament arrangement according to an exemplifying embodiment of the present invention.

DETAILED DESCRIPTION

Figure 4A:
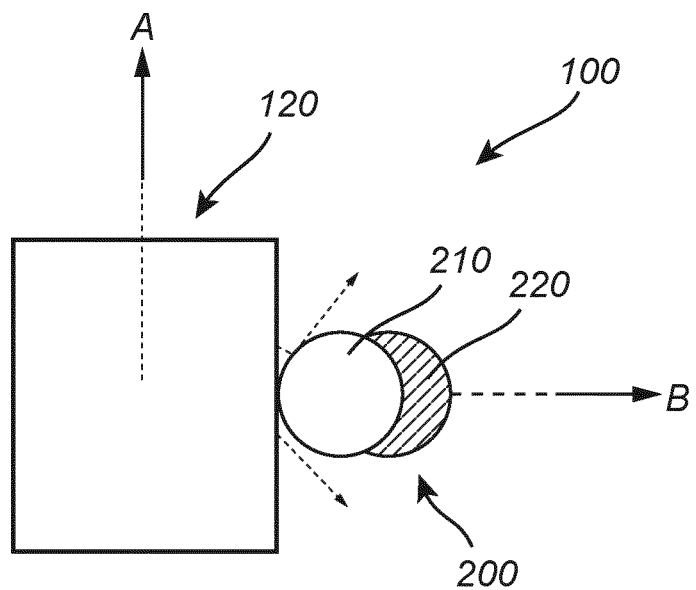

FIG. 1 shows a LED filament lamp 10 according to the prior art, comprising a plurality of LED filaments 20. LED filament lamps 10 of this kind are highly appreciated as they are very decorative. Furthermore, these LED filament lamps 10 provide numerous advantages compared to incandescent lamps such as a longer operational life, a reduced power consumption, and an increased efficiency related to the ratio between light energy and heat energy. However, there is a wish to provide alternatives for the arrangement of the components of the LED filament lamps, in particular regarding LED filament lamps comprising one or more reflectors. More specifically, LED filament lamps may have an efficiency which is unsatisfactory.

FIG. 2 schematically shows a cross-sectional view of a LED filament arrangement 100 according to an exemplifying embodiment of the present invention. The LED filament arrangement 100 comprises a LED filament 120, elongating along an axis A. The LED filament 120 may preferably have a length L in the range from 1 cm to 20 cm, more preferably 2 cm to 12 cm, and most preferred 3 cm to 10 cm. The LED filament 120 may preferably have a width W in the range from 0.5 mm to 10 mm, more preferably 0.8 mm to 8 mm, and most preferred 1 to 5 mm. The aspect ratio L/W is preferably at least 5, more preferably at least 8, and most preferred at least 10.

The LED filament 120 of the LED filament arrangement 100 comprises an array or "chain" of LEDs 140 which is arranged on a substrate 125 of the LED filament 120. For example, the array or "chain" of LEDs 140 may comprise a plurality of adjacently arranged LEDs 140 wherein a respective wiring is provided between each pair of LEDs 140. The plurality of LEDs 140 preferably comprises more than 5 LEDs, more preferably more than 8 LEDs, and even more preferred more than 10 LEDs. The plurality of LEDs 140 may be direct emitting LEDs which provide a color. The LEDs 140 are preferably blue LEDs. The LEDs 140 may also be UV LEDs. A combination of LEDs 140, e.g. UV LEDs and blue light LEDs, may be used. The LEDs 140 may comprise laser diodes. The light emitted from the LED filament 120 during operation is preferably white light. The white light is preferably within 15 SDCM (standard deviation of color matching) from the black body locus (BBL). The color temperature of the white light is preferably in the range of 2000 to 6000 K, more preferably in the range from 2100 to 5000 K, most preferably in the range from 2200 to 4000 K such as for example 2300 K or 2700 K. The white light has preferably a CRI of at least 75, more preferably at least 80, most preferably at least 85 such as for example 90 or 92.

In FIG. 2, the LED filament 120 of the LED filament arrangement 100 further comprises an encapsulant 145 comprising a translucent material, wherein the encapsulant 145 at least partially encloses the plurality of LEDs 140. For example, and as indicated by the cross-sectional view in FIG. 2, the encapsulant 145 fully encloses the plurality of LEDs 140. The encapsulant 145 may comprise a luminescent material, which is configured to emit light under external energy excitation. For example, the luminescent material may comprise a fluorescent material. The luminescent material may comprise an inorganic phosphor, and organic phosphor and/or quantum dots/rods. The UV/blue LED light may be partially or fully absorbed by the luminescent material and converted to light of another color e.g. green, yellow, orange and/or red. The LED filament arrangement 100 in FIG. 2 further comprises a reflector element 200 which is configured to at least partially reflect the light emitted from the LED filament 120 during operation of the LED filament arrangement 100. It will be appreciated that further details, embodiments, etc., of the reflector element 200 is presented in the following figures and associated text.

FIG. 3 schematically shows a LED filament arrangement 100 according to an exemplifying embodiment of the present invention. It will be appreciated that the LED filament arrangement 100 may be provided in a LED filament lamp according to FIG. 1 or in substantially any other lighting device, arrangement or luminaire. The LED filament arrangement 100 comprises a LED filament 120, e.g. according to FIG. 2. It should be noted that there may be a plurality of LED filaments, whereas only one LED filament 120 is shown in FIG. 3 for an increased understanding. The LED filament 120 comprises a plurality of LEDs (not shown) and an encapsulant 145 which encloses the plurality of LEDs, e.g. according to FIG. 2.

The LED filament arrangement 100 in FIG. 3 further comprises a reflector element 200. The reflector element 200 is configured to at least partially reflect the light emitted from the LED filament 120 during operation of the LED filament arrangement 100. The reflectivity of the reflector element is preferably at least 80%, more preferred at least 85%, and most preferred at least 90%. The reflector element 200 has a spiral or coil shape and is arranged or wound at least partially around the LED filament 120. Hence, the reflector element 200 extends along the axis A of the LED filament 120. In the embodiment of the LED filament arrangement 100 shown in FIG. 3, the reflector element 200 has the shape of a wire with a round cross-section. However, it will be appreciated that the reflector element 200 may have substantially any other shape. Furthermore, the wire-shaped shaped reflector element 200 has a cross-section (i.e. diameter) which is smaller than the cross-section of the LED filament 120.

Figure 4B:
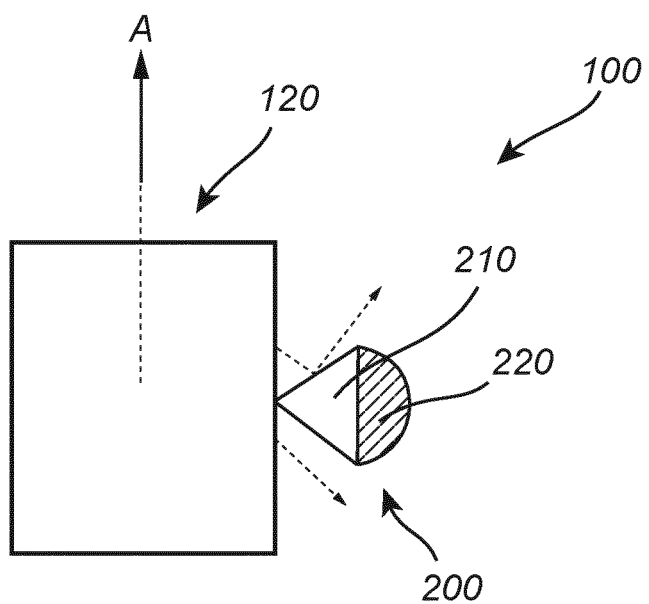

FIG. 4a-b show schematic cross-sections of a portion of a LED filament arrangement 100 according to an exemplifying embodiment of the present invention, e.g. according to the LED filament arrangement shown in FIG. 3. The reflector element 200 comprises a first portion 210 which faces the LED filament 120, wherein the first portion 210 is arranged to reflect the light emitted from the plurality of LEDs of the LED filament 120 during operation of the LED filament arrangement 100. The second portion 220 of the reflector element 200 faces away from the LED filament 120. The second portion 220 of the reflector element 200 is opaque, i.e. non-transmissive. Hence, the first 210 and second 220 portions of the reflector element 200 are adjacently arranged along an axis, B, perpendicular to the axis, A, of the LED filament 120. During operation of the LED filament arrangement 100, the light emitted from the plurality of LEDs of the LED filament 120 is diffracted and/or reflected by the first portion 210 of the reflector element 200. The first portion 210 may, for example, comprise a coating which comprises particles selected from the group consisting of $Al_2O_3$, $BaSO_4$, and $TiO_2$. Alternatively, or in combination, the first portion 210 of the reflector 200 may comprise at least one surface which has been treated for diffuse reflection of the light emitted from the plurality of LEDs of the LED filament 120.

The opaque (e.g. black-colored) second portion 220 of the reflector element 200 is non-transmissive, i.e. it does not transmit any light and may be light absorbing. Hence, the first portion 210 of the reflector element 200 is able to reflect a portion of the light emitted from the plurality of LEDs of the LED filament 120 in a desired way. The second portion 220 of the reflector element 200 may be light-absorbing, and may thereby be configured to block the light emitted from the plurality of LEDs 140 of the LED filament 120, e.g. in the direction of an observer.

According to the exemplifying embodiment of the portion of the LED filament arrangement 100 of FIG. 4a, the first portion 210 of the reflector element 200 has a circular shape (i.e. a circular cross-section), and reflects and/or diffracts the light emitted from the plurality of LEDs of the LED filament 120 during operation of the LED filament arrangement 100.

FIG. 4b shows a schematic cross-section of a portion of a LED filament arrangement 100 according to an exemplifying embodiment similar to FIG. 4a. The reflector element 200 comprises a first portion 210 which faces the LED filament 120, wherein the first portion 210 is arranged to reflect the light emitted from the plurality of LEDs of the LED filament 120 during operation of the LED filament arrangement 100. The second portion 220 of the reflector element 200 faces away from the LED filament 120. The second portion 220 of the reflector element 200 is opaque, i.e. non-transmissive. As the portion of the LED filament arrangement 100 as shown in FIG. 4b is similar to that of FIG. 4a, it is referred to FIG. 4a and the associated text for a more detailed description of the specific features. However, the exemplifying embodiment of FIG. 4b differs from that of FIG. 4b in that the first portion 210 of the reflector element 200 has a cone shape (i.e. a triangular cross-section), wherein the apex (tip) of the cone-shaped first portion 210 faces the LED filament 120.

FIGS. 4a-b show embodiments of portions of the LED filament arrangement 100 wherein the reflector element 200 is in (direct) physical contact with the LED filament 120. This arrangement increases the thermal connection between the LED filament 120 and the reflector element 200 for a dissipation of heat from the at least one LED filament 120 during operation of the LED filament arrangement 100. Alternatively, the reflector element 200 and the LED filament 120 may be separated (not shown), wherein the thermal connection may be enabled via heat radiation.

Figure 5:
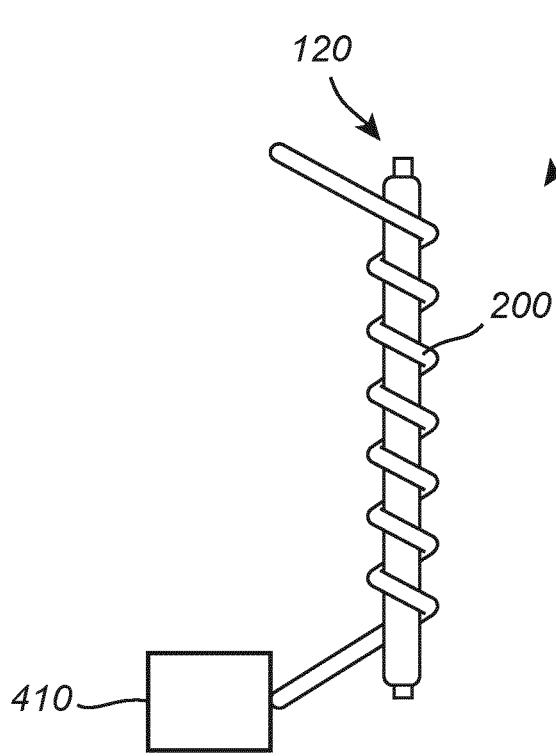

FIG. 5 schematically shows a LED filament arrangement 100 according to an exemplifying embodiment of the present invention. Here, the wire-shaped reflector 200, which is wound around the LED filament 120 in a spiral shape, further extends to other areas or spaces away from the LED filament 120 for a dissipation of heat from the LED filament 120 during operation of the LED filament arrangement 100. The LED filament arrangement 100 may further comprise a heat dissipator 410. The heat dissipator 410 is coupled to the reflector element 200 for a dissipation of heat from the LED filament 120 to the heat dissipator 410 during operation of the LED filament arrangement 100. Hence, the heat dissipator 410 may efficiently and conveniently dissipate excessive heat from the plurality of LEDs 140 of the LED filament 120 during operation of the LED filament arrangement 100.

Figure 6:
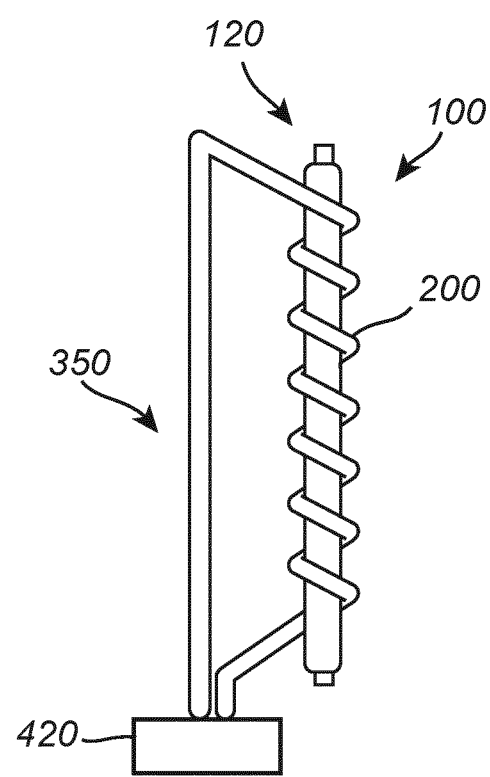

FIG. 6 schematically shows a LED filament arrangement 100 according to an exemplifying embodiment of the present invention. It will be appreciated that the LED filament arrangement 100 as shown is similar to that shown in FIG. 5, and it is referred to FIG. 5 and the associated text for a more detailed description of the specific features. In FIG. 6, the LED filament arrangement 100 further comprises a frame 350 for supporting the LED filament 120. Here, the frame 350 constitutes a portion of the reflector element 200. The frame 350 further comprises a foundation 420. The foundation 420 may, as an example, comprise a heat dissipator for removal of excessive heat from the LED filament 120.

Figure 7:
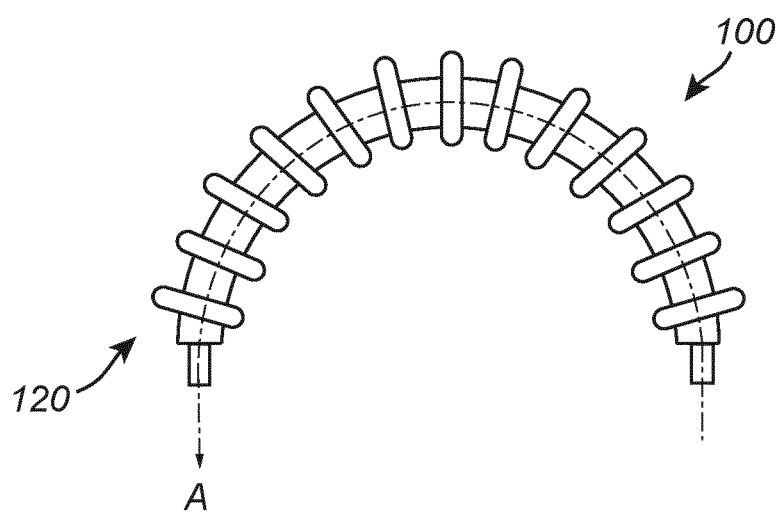

FIG. 7 schematically shows a LED filament arrangement 100 according to an exemplifying embodiment of the present invention. It will be appreciated that the LED filament arrangement 100 as shown is similar to that shown in FIG. 3, and it is referred to FIG. 3 and the associated text for a more detailed description of the specific features. However, the LED filament 120 of FIG. 7 differs from that of FIG. 3 in that the LED filament 120 extends along a curved axis, A.

Figure 8:
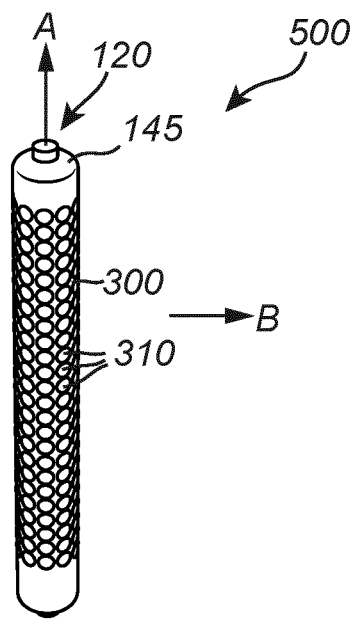

FIG. 8 schematically shows a LED filament device 500 according to an exemplifying embodiment of the second aspect of the present invention. Similar to the LED filament arrangement and its components according to one or more of FIGS. 2-7, the LED filament device 500 comprises a LED filament 120 comprising an array of a plurality of LEDs (not shown). The LED filament 120 further comprises an encapsulant 145 comprising a translucent material, wherein the encapsulant 145 at least partially encloses the plurality of LEDs. The LED filament device 500 further comprises a reflector structure 300 which is configured to at least partially reflect the light emitted from the plurality of LEDs of the LED filament 120 during operation of the LED filament device 500. In contrast to the spiral-shaped reflector structure as shown in FIG. 3, the reflector structure 300 of the LED filament device 500 has a tubular shape arranged at least partially around the LED filament 120. The reflector structure 300 of FIG. 8 and the reflector element 200 of FIG. 3 have the common purpose of at least partially reflecting the light emitted from the LED filament(s) 120 during operation. Moreover, and similar to the reflector element 200 of FIG. 3, the reflector structure 300 comprises a first portion and a second portion (not shown). The first portion of the reflector structure 300 faces the LED filament and is arranged to reflect the light emitted from the plurality of LEDs of the LED filament 120 during operation of the LED filament device 500. The second portion of the reflector structure 300 faces away from the LED filament 120 and is opaque, i.e. non-transmissive. It will be appreciated that other features of the reflector element 200 of the LED filament arrangement 100 in FIG. 3 may be the same or similar to the reflector structure of the LED filament device 500 in FIG. 8, such as the selected material(s), coating(s), shapes, etc. The tubular-shaped reflector structure 300 comprises a plurality of holes 310, which penetrate or perforate the reflector structure 300. The area of the plurality of holes 310 with respect to the circumferential area of the reflector structure 300, in a direction, B, perpendicular to the axis, A, is preferably at least 50%, more preferred at least 60%, and most preferred at least 65%.

Figure 9:
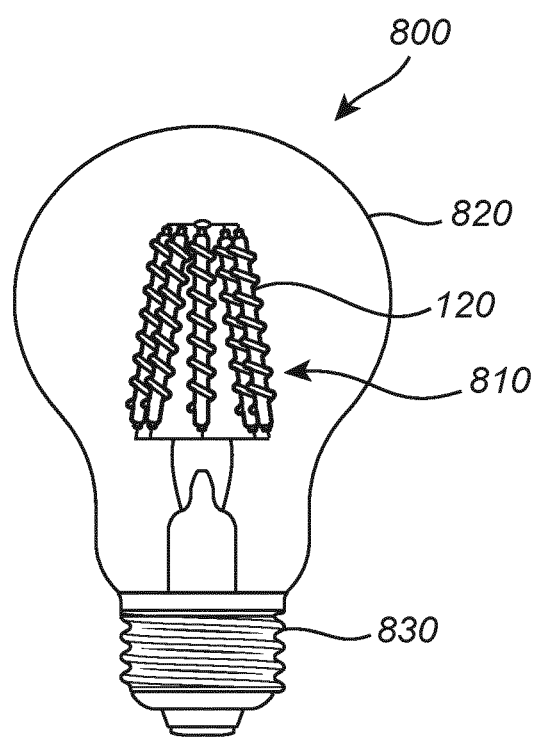

FIG. 9 schematically shows a lighting device 800 according to an exemplifying embodiment of the present invention. The lighting device 800 comprises a light source 810 which in turn may comprise a LED filament arrangement and/or a LED filament device according to any one of the preceding FIGS. 2-8. As exemplified in FIG. 9, the lighting device 800 comprises a LED filament arrangement which in turn comprises five LED filaments 120. It should be noted that the number of LED filaments 120 is arbitrary, and that the lighting device 800 may comprises substantially any number of LED filaments 120. Here, the lighting device 800 comprises a LED filament arrangement according to FIG. 3, i.e. wherein a reflector element is arranged (wound) around each of the LED filaments 120. The lighting device 800 further comprises a cover 820 comprising an at least partially transparent material. The cover 820, which at least partially encloses the light source 810, is exemplified as being bulb-shaped. The lighting device 800 further comprises an electrical connection 830 connected to the LED filament arrangement for a supply of power to the plurality of LEDs of the LED filaments 120.

The person skilled in the art realizes that the present invention by no means is limited to the preferred embodiments described above. On the contrary, many modifications and variations are possible within the scope of the appended claims. For example, one or more of the LED filament(s) 120, the reflector element(s) 200, 300, etc., may have different shapes, dimensions and/or sizes than those depicted/described.

The invention claimed is:

1. A light emitting diode, LED, filament arrangement, comprising
    at least one LED filament comprising an array of a plurality of light emitting diodes, LEDs, wherein the at least one LED filament extends along an axis, A, and
    at least one reflector element configured to at least partially reflect the light emitted from the at least one LED filament during operation, wherein the at least one reflector element comprises
    a first portion facing the at least one LED filament, wherein the first portion is arranged to reflect and/or diffract the light emitted from the at least one LED filament during operation, and
    a second portion facing away from the at least one LED filament, wherein the second portion is opaque and
    said at least one reflector element has a spiral shape and is arranged at least partially around the at least one LED filament such that the at least one reflector element extends along the axis;
    wherein the at least one reflector element is in thermal connection with the at least one LED filament for a dissipation of heat from the at least one LED filament during operation.

2. The LED filament arrangement according to claim 1, wherein the at least one reflector element has a wire shape and has a cross-section which is smaller than the cross-section of the at least one LED filament.

3. The LED filament arrangement according to claim 2, wherein the first portion has a wire shape with a circular cross-section.

4. The LED filament arrangement according to claim 1, wherein the second portion is light absorbing.

5. The LED filament arrangement according to claim 1, wherein the first portion has a cone shape in cross-section, wherein the apex of the first portion faces the at least one LED filament.

6. The LED filament arrangement according to claim 1, further comprising an encapsulant at least partially enclosing the plurality of LEDs, wherein the encapsulant comprises a luminescent material and is configured to at least partly convert the light emitted by the plurality of LEDs.

7. The LED filament arrangement according to claim 1, wherein the reflectivity of the at least one reflector element is at least 80%, such as at least 85%, such as at least 90%.

8. The LED filament arrangement according to claim 1, further comprising a heat dissipator coupled to the at least one reflector element for a dissipation of heat from the at least one LED filament to the heat dissipator during operation of the at least one LED filament.

9. The LED filament arrangement according to claim 1, wherein at least one of the at least one LED filament and at least one of the at least one reflector element are in physical contact with each other.

10. The LED filament arrangement according to claim 1, wherein at least one of the at least one LED filament and at least one of the at least one reflector element are arranged at a distance from each other in a direction, B, perpendicular to the axis, A.

11. A lighting device, comprising
    a light source comprising at least one LED filament arrangement according to claim 1,
    a cover comprising an at least partially transparent material, wherein the cover at least partially encloses the light source, and
    an electrical connection connected to the light source for a supply of power to the plurality of LEDs of the light source.

* * * * *